United States Patent [19]

Wagner

[11] Patent Number: 4,550,332

[45] Date of Patent: Oct. 29, 1985

[54] GATE CONTROLLED SEMICONDUCTOR DEVICE

[75] Inventor: Siegfried Wagner, Karl-Marx-Stadt, German Democratic Rep.

[73] Assignee: Veb Zentrum für Forschung und Technologie Mikroelektronik, Dresden, German Democratic Rep.

[21] Appl. No.: 319,369

[22] Filed: Nov. 9, 1981

Related U.S. Application Data

[63] Continuation-in-part of Ser. No. 316,603, Oct. 30, 1981, abandoned.

[30] Foreign Application Priority Data

Oct. 30, 1980 [DD] German Democratic Rep. ... 224827

[51] Int. Cl.[4] ............... H01L 29/78; H01L 29/74
[52] U.S. Cl. ............................... 357/38; 357/49; 357/55; 357/23.4; 357/23.7; 357/23.8
[58] Field of Search ............... 357/38, 23 VD, 38 T, 357/49, 23 TF, 55, 23 HV

[56] References Cited

U.S. PATENT DOCUMENTS

| | | | |
|---|---|---|---|
| 3,812,405 | 5/1974 | Clark | 357/38 |
| 3,943,555 | 5/1976 | Mueller et al. | 357/49 |
| 4,193,836 | 3/1980 | Youmans et al. | 357/49 |
| 4,199,774 | 4/1980 | Plummer | 357/38 |
| 4,224,634 | 9/1980 | Suedberg | |
| 4,253,162 | 2/1981 | Hollingsworth | 357/23 TF |
| 4,329,705 | 5/1982 | Baker | 357/23 VD |
| 4,364,073 | 12/1982 | Becke et al. | 357/38 |

FOREIGN PATENT DOCUMENTS 544079  1/1979  Japan ............... 357/23 VD

*Primary Examiner*—Martin H. Edlow
*Assistant Examiner*—Jerome Jackson, Jr.
*Attorney, Agent, or Firm*—Michael J. Striker

[57] ABSTRACT

A gate-controlled semiconductor device comprises a semiconductor substrate disposed on a support element, where the semiconductor substrate has a recess protruding from the top surface into the semiconductor substrate for forming a gate electrode. An insulating layer covers the semiconductor and the recess and has at least two openings each having an electrode attached. In the semiconductor an npnp-transition is formed, which can be fired and interrupted by the gate electrode. The semiconductor device is useful in power control circuits, where it is important to control and switch large power signals with very small control signals.

10 Claims, 3 Drawing Figures

GATE CONTROLLED SEMICONDUCTOR DEVICE

CROSS-REFERENCE TO RELATED APPLICATION

This application is a Continuation-in-Part application of my copending application Ser. No. 316,603, filed Oct. 30, 1981, now abandoned.

BACKGROUND OF THE INVENTION

The present invention relates to a gate controlled semiconductor device providing control of a large power signal with small control signals.

The field of application of the invention relates to power control circuits, where it is important to control and switch large power signals with very small control signals, such as for example at the interface between data processing microelectronics and controlled power circuits, or at connection points between different circuits, for example in telecommunications, telephone technology, or in controlled drives for electric motors, or in power supplies.

Conventionally controlled semiconductor devices which include pnpn-type switches are thyristors (silicon controlled rectifiers). Such known pnpn-type switches are bipolar devices with a layer sequence n+ pnp+, which are provided with external contacts at the n+-layer (cathode), the p+-layer (anode) and at the inner p-layer (anode gate), and more rarely at the inner n-layer (control gate). These bipolar devices show symmetrical characteristics. However, they can be connected in an antiparallel circuit within a semiconductive layered body to form symmetrically acting devices, such as, for example, triacs. Thyristors, when connected to a reverse voltage (a negative anode voltage) below their breakdown point, block current in either direction. Only with a positive anode voltage and after the application of a triggering signal to the control gate, is the thyristor switched over into a highly conductive state.

It is disadvantageous however, that relatively large currents and powers are required at the control gate, and after triggering, the control gate becomes ineffective. The conducting state of these pnpn-type switches can be interrupted only with difficulty, and interruption or reversal of the anode voltage is necessary for this purpose.

Known is also a thyristor employing an insulated gate and being based on the known design of the double-diffusion-MIS-field effect-transistor (DMOS-transistor), which by the addition of one or two diffusion areas is modified to a symmetrical pnpn-type switch or respectively, to a two-directional pnpn-type switch.

It is true that the latter pnpn-type switch or thyristor provides the possibility of a nearly power-free turning-on but its conducting condition is not completely controllable by the gate electrode. Consequently, this pnpn-type switch needs an additional current interruption circuit having the disadvantages described above.

The interruptor circuit, which comprises MIS- and bipolar transistors, can be integrated in the pnpn-type switch. This measure, however, would again be disadvantageous for the application in power switching devices.

SUMMARY OF THE INVENTION

It is an object of the invention to simplify the construction of power switching semiconductive controlled devices as compared with conventional pnpn-type controlled switches.

An additional object of this invention is to provide such an improved semiconductive controlled switching device which can be economically produced with known technologies of microelectronics.

It is another object of the invention to provide a gated or controllable semiconductor device having properties similar to those of known pnpn-type switches or thyristors, and which can be controlled by its gate substantially without power consumption.

The present invention provides a gate controlled semiconductor device which comprises a support element of insulating or semiconductive material and a semiconductor substrate disposed on the support element. The substrate has a V-or U-shaped recess which protrudes from the top surface into the semiconductor substrate. A first insulating layer covers the recess and an electrically conducting layer is disposed on the first insulating layer and connected to a gate electrode. A second insulating layer adjacent to the first insulating layer covers the top of the semiconductor substrate and is provided with at least two openings A second conducting layer is disposed in one opening located close to one side of the gate electrode. A cathode electrode is connected to the second conducting layer. A first semiconducting region having the same type of majority carriers as the substrate but of larger concentration than that of the substrate, is disposed in contact with a portion of the second conducting layer and extending up to the neighboring side of said recess in the semiconductor substrate. A third conducting layer is disposed in the second opening located at the second side of the recess. A second electrode is connected to the third conducting layer. A second semiconducting region which has the opposite type of majority carriers as the substrate and of a larger concentration of dopants than that of the substrate, is in contact with the third conducting layer. The semiconductor substrate can extend to the second side of the recess. A channel region is provided in the substrate below the second conducting layer. The majority carriers in the channel region are of the type opposite to the substrate region. The channel region is bounded by the lower portion of the recess, by the substrate and by the first semiconducting region.

The conducting layers can comprise a metal or polycrystalline silicon. The substrate can have electrons or holes as majority carriers. The semiconducting substrate can be disposed on an insulating support. In this case the semiconductor substrate can have a thickness of from about 0.5 to 5 microns. The substrate can comprise an area with a higher concentration of majority carriers, the latter area begining at the second side of the recess and extending along the upper surface of the semiconductor substrate in the direction toward the second semiconducting area.

In accordance with the present invention the V- or U-shaped recess is produced in conventional way in the semiconductive substrate. An insulating layer is provided on the V- or U-shaped recess. An electrically conducting layer is applied to the insulating layer. The electronically conducting layer comprises preferably metal or polycrystalline silicon and has a connector which represents the control electrode of the semiconductor element.

In accordance with the invention the insulating layer is provided with an opening disposed close to the recess. A further electrically conducting layer is located in the opening and is connected to the first electrode. Below the conducting layer there is provided in the semiconductor substrate a first region acting as a first semiconducting area. This region is preferably of n+-type doping and reaches up to the adjacent side of the V- or U-shaped recess.

A second opening is formed in the insulating layer on the semiconductor substrate, opposite the other side to the recess. Another electrically conducting layer is disposed in the second opening and is connected to a second electrode. Below the conducting layer, there is provided in the semiconductor material a second region. This region is preferably of p+-type doping. A substrate area extending from this region in the direction of the recess, is preferably n-type doped and it reaches as far as to the corresponding side of the recess, although it is not necessary to touch this side. A preferably p-doped channel region is located below the recess, and adjoins the first region, the substrate area and the recess.

The operation of the controlled semiconductor device according to the present invention is based on the fact that the first electrode upon n+-doping of the first electrode region represents a cathode, and the second electrode upon p-doping of the second region represents an anode (which arrangement is oomparable to conventional pnpn-type silicon controlled switches), and the current between these two electrodes is controllable via a control electrode. Upon application of a D-C voltage between the first electrode region and the second electrode region (the second electrode being connected to the plus pole or in forward direction), and upon application of a suitable voltage to the gate electrode, an inversion channel is formad between the edge area of the insulating layer of the recess and the neighboring semiconductor material.

The current determined by the gate voltage flows in this inversion channel between the first electrode region and the substrate area. Due to the channel current, a shift of potential of the substrate area to a more negative value takes place. Thereby the blocking voltage across the p-n junction between the channel and the substrate area is somewhat decreased, whereby a larger part of the voltage drop between the first and second electrode occurs at the p-n junctions (polarized in the flow direction) between the first region and the channel region as well as between the substrate area and the second region. As a consequence, these p-n junctions intensively emit charge carriers across the total cross-section of the substrate area to the p-n junction between channel region and substrate area, whereby a sudden change to a low resistance (fired) state will occur.

If the voltage between the first and the second electrode is reversely biased, that is the second electrode is negative with respect to the first electrode, then the two mutually independent p-n junctions between the first region and the channel region and between the substrate area and the second region, are blocked and they receive the full voltage between the first and second electrode. Only the reverse current flows, and the reverse current is additionally reduced by the recess protruding into the channel region. Thus a larger current can be obtained only by increasing the voltage beyond the break-through voltage.

An application of a voltage to the control gate does not result in a conducting state of the semiconductor device in reverse bias direction. There is the possibility that the first electrode region and the channel region and the first electrode are connected to each other for providing an electrically conducting connection. Such a conductive connection can achieve full controllability of the device. After firing, the blocked state can again be established by the control gate, since the p-n junction between the first region and the channel area is not fully forward biased as is the case in a device lacking the electrically conducting connection, because the first region and the channel region are at the same potential.

Thus this p-n junction predominantly emits charge carriers via the inversion channel and not via the total cross-carriers section of the substrate area. If the inversion channel is interrupted by removal of the control voltage at the control gate, then the potential shift of the substrate area does not take place and the controllable semiconductor device is interrupted.

The same mode of operation has a semiconductor device where additionally or alternatively the cross-section has been decreased, preferably by using on the support a thin semiconductive layer in the order of magnitude from about 0.5 to 5 microns. Thus the cross-section of the channel region under the recess is decreased such that emission of charged carriers of the p-n junction is reduced over the full cross-section of the substrate and a major part of the charge carriers flow via the inversion channel. As a consequence, the controllability of the semiconductor device is maintained or is enhanced.

The substrate area can comprise a region of higher concentration of dopants. Such a region can start at the side of the recess which adjoins the substrate area and extends under the upper surface of the semiconductor material toward the second electrode region. The region of higher concentration of dopants however, does not touch the second electrode region.

This arrangement provides for an improvement of the controllability and of the dielectric strength of the device by employing a favorable form of the space charge distribution and the electrical field.

In a further embodiment of the semiconductor device of this invention the semiconductor layers under the second electrode are like a mirror image of those under the first electrode. In this embodiment, an additional V- or U-shaped recess is provided between the recess and the second electrode, the addition recess having also an insulating layer and an electrode whereby the layer structure under the additional recess is identical to a mirror image of the layer structure under the first recess.

The operation of this embodiment is such that upon applying a voltage between the first electrode and the second electrode, the flow of current through the semiconductor device can be controlled by means of the control gate and/or by the additional control gate which can be conductively connected to the first mentioned control gate. There is a dependence on the polarity of the voltage applied between the first and the second electrode. Upon application of a voltage to the first electrode which can be either positive or negative relative to the second electrode, the firing of the semiconductor device can occur in the before described manner.

All before described embodiments of the semiconductor device according to the present invention can be constructed such that the p-type and n-type doping can be reversed in the regions described whereby the operation remains the same.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWINGS

In the accompanying drawings in which three of the various possible embodiments of the invention are illustrated.

DESCRIPTION OF INVENTION AND PREFERRED EMBODIMENTS

Silicon is employed as a semiconductor substrate material in the embodiments. However, the following description is also applicable to other semiconductive materials.

Figure 1:
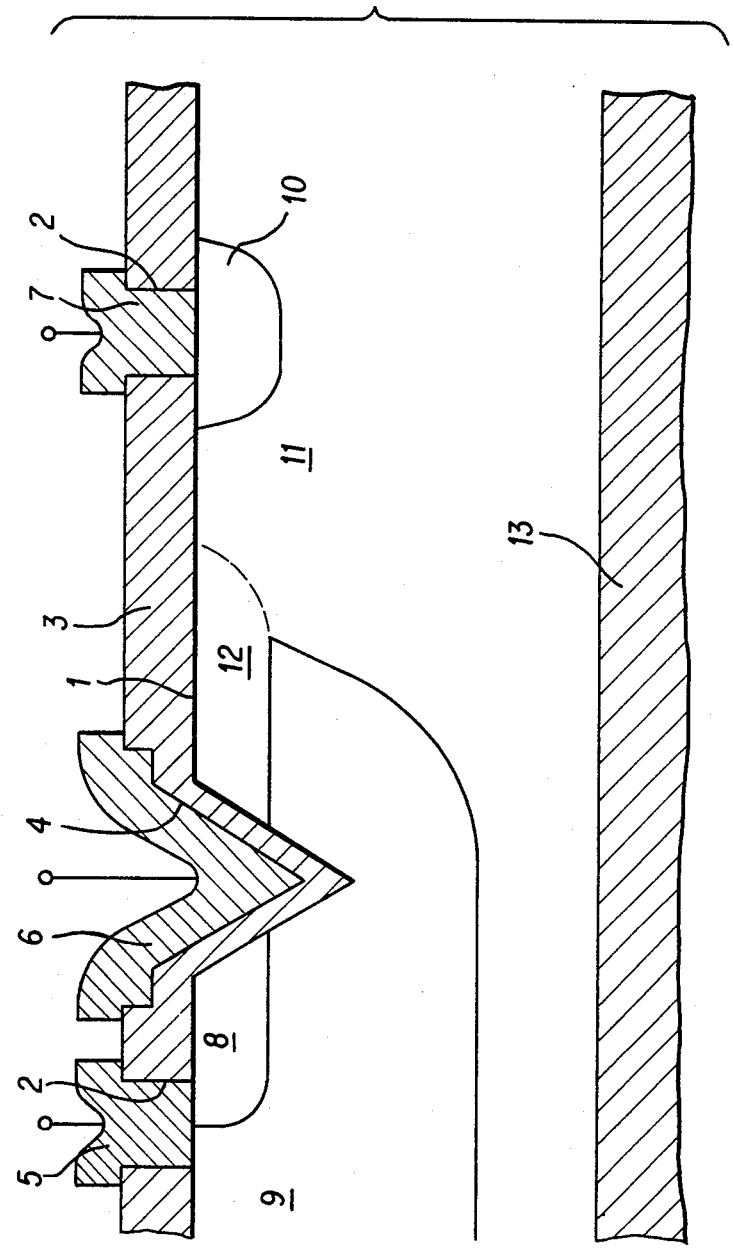
FIG. 1 shows a sectional view of a semiconductor device according to the invention having asymmetrical construction.

An insulating layer 3 with openings 2 is applied to the upper surface 1 of the semiconductor substrate 11 of the controllable semiconductor device according to FIG. 1. In the area of a V-shaped recess 4 which has been etched into the semiconductor material 11, the thickness of the insulating layer 3 is reduced to about 0.1 micron. In this area the insulating layer comprises thermally oxidized silicon dioxide ($SiO_2$) and the remainder of the surface 1 has an insulating layer of deposited $SiO_2$ (field oxide). Layers of metal or polycrystalline silicon are applied in the openings 2 of the insulating layer 3 and are provided with contact leads. The electrically conducting layer in the first opening 2 at the left side of the recess 4 is the cathode electrode disposed in the insulating layer 3. A control gate electrode 6 is formed on the electrically conducting layer located on the insulating layer 3 in the region of the recess 4. The second opening 2 which is disposed in the insulating layer 3 to the right of the recess 4 contains the electrically conducting layer of the anode electrode 7.

An $n^+$-doped first region 8 is disposed under a portion of the cathode electrode 5 and extends to the left side of the recess 4. The remaining lower surface portion of cathode electrode 5 adjoins a p-doped channel region 9. The channel region 9 has a trough-like shape and extends from the cathode electrode 5 below the $n^+$-doped first region 8, then surrounds the tip of the V-shaped recess 4 and ends at the right of the recess 4 at the level of the first region 8. A $p^+$-doped second region 10 is disposed under the anode electrode 7 and also has a trough-like shape. The semiconductor material into which the doped areas are applied is n-doped and represents the substrate area 11.

The substrate area 11 comprises a region 12 of a higher concentration of dopants, with an order of magnitude of more than $10^{19}$ cm$^{-3}$. The region 12 extends from the right side of the recess 4 in the direction of the second electrode region 10 above the channel region 9.

A p-doped semiconductor material can be used for the support layer 13. The substrate area 11 has a concentration of doping material of from about $10^{13}$ to $10^{15}$ and preferably about $10^{14}$ cm$^{-3}$, the channel region 9 has an acceptor concentration in the order of magnitude from $10^{16}$ to $10^{17}$ cm$^{-3}$, the first region 8 has a doping material concentration of more than $10^{19}$ cm$^{-3}$ and the second electrode region 19 has an acceptor concentration of from $10^{17}$ to $10^{21}$ cm$^{-3}$.

The thickness of the insulating layer 3 covering the recess 4 is about from 0.05 to 0.3 microns and the remaining insulation layer 3 covering the top of the semiconductor substrate has a thickness of more than 0.3 microns.

In the following there is illustrated the mode of operation of the semiconductor device shown in FIG. 1.

In reverse bias a voltage negative with respect to the cathode electrode 5 is applied to the anode electrode 7. Initially the voltage between the control gate electrode 6 and the anode electrode is zero or less than a threshold voltage. Thus the p-n junction between the second electrode region 10 and the substrate area 11 is blocked and the corresponding space charge zone which extends far into the substrate area 11 absorbs the largest part of the applied voltage between the cathode electrode 5 and the anode electrode 7. The p-n junction between the substrate area 11 inclusive of region 12 of higher doping material concentration and the channel region 9 is open and its space charge zone is small. The p-n junction between the first region 8 and the channel region 9 cannot produce a larger potential difference, since the common contact of the cathode electrode 5 places both regions at about the same potential.

When control electrode 6 is regatively biased relative to the cathode electrode 5, then the first $n^+$-doped region 8 and the region 12 of higher concentration in the substrate area 11 are unaffected and an inversion channel is formed at the channel region 9 at the surface 1 of the semiconductor in the area of the recess 4 in the semiconductor material. The inversion channel connects the first region 8 and the region 12 of higher concentration of the substrate area 11. However, the current flowing in the inversion channel is small, since between the two regions 8 and 12 there is applied only a low voltage based on the open p-n junction between the channel region 9 and the substrate area 11. The control voltage at the control electrode 6 therefor is not very influential under reverse biasing.

In forward biasing, a positive voltage is applied to the anode electrode 7 relative to the cathode electrode. Initially, the control gate electrode 7 is at the potential of the cathode electrode 5, or below the threshold voltage. The p-n junction between the channel region 9 and the substrate area 11 is blocked and the corresponding space charge zone expands in particular into the less heavily doped regions. It grows with increasing voltage from the boundary of the highly doped region 12 to below the channel region 9, while the space charge zone at the boundary between the channel region 9 and the weakly doped substrate 11 expands further into the substrate area 11.

The space charge zones of the p-n junctions between the first region 8 and the channel region 9 as well as between the second region 10 and the substrate area 11 area narrow, since they are forward biased. The voltage drop across the p-n junction between the first region 8 and the channel region 9 is very small because of the common contact at the cathode electrode 5. These two forward biased p-n junctions emit charge carriers toward the blocked p-n junction between channel region 9 and substrate area 11. The main part of the voltage between the cathode electrode 5 and the anode electrode 7 drops at this blocked p-n junction.

Due to the common contact of the channel region 9 and the first region 8 at the cathode electrode 5 and the resulting voltage equilibrium between both regions 5 and 8, the carrier emission at the p-n junction between the regions 5 and 8 is weak and in addition the decreased cross-section of the semiconductor material below the recess 4 interferes with the charge flow. Therefore, no switch-over into the low-resistance state (firing) of semiconductor device will occur.

The p-n junction between the support layer 13, which comprises p-doped semiconductor material, and the substrate area 11 is without functional importance both for forward biasing as well as for reverse biasing, since in any case this junction is biased in blocking direction.

If a positive voltage, which is larger than the threshold voltage, is applied to the control electrode 6 relative to the cathode electrode 5, then the portion of surface 1 of the semiconductor material in the area of the recess 4 between the first region 8 and the region 12 of higher concentration is bridged due to the formation of the inversion channel in the semiconductor material. The electron current in the channel shifts the potential of the substrate area 11 to negative values. The p-n junction between the second area 10 and the substrate area 11 is opened further and emits a stream of holes to the blocked p-n junction between the channel region 9 and the substrate area 11, from which it passes via the channel region 9 to the cathode electrode 5. The inversion channel and the hole stream from the second region 10 reduce to small values the blocking voltage at the blocked p-n junction between the channel region 9 and the substrate area 11. The formation of the inversion channel effected by the control voltage results in a large current and in a decrease of the voltage between the cathode electrode 5 and the anode electrode 7, and the semiconductor device has fired.

The voltage between the two electrodes 5 and 7 after ignition depends on the control voltage at the control gate electrode 6. The control voltage has to be applied continously in order to main the fired or on-state.

If the control voltage is lowered to zero or drops below the threshold voltage, then the semiconductor device becomes non-conductive.

Thus, the conductive state of the device of FIG. 1 can be interrupted by the control gate electrode, which represents a particular advantage of this embodiment.

Figure 2:
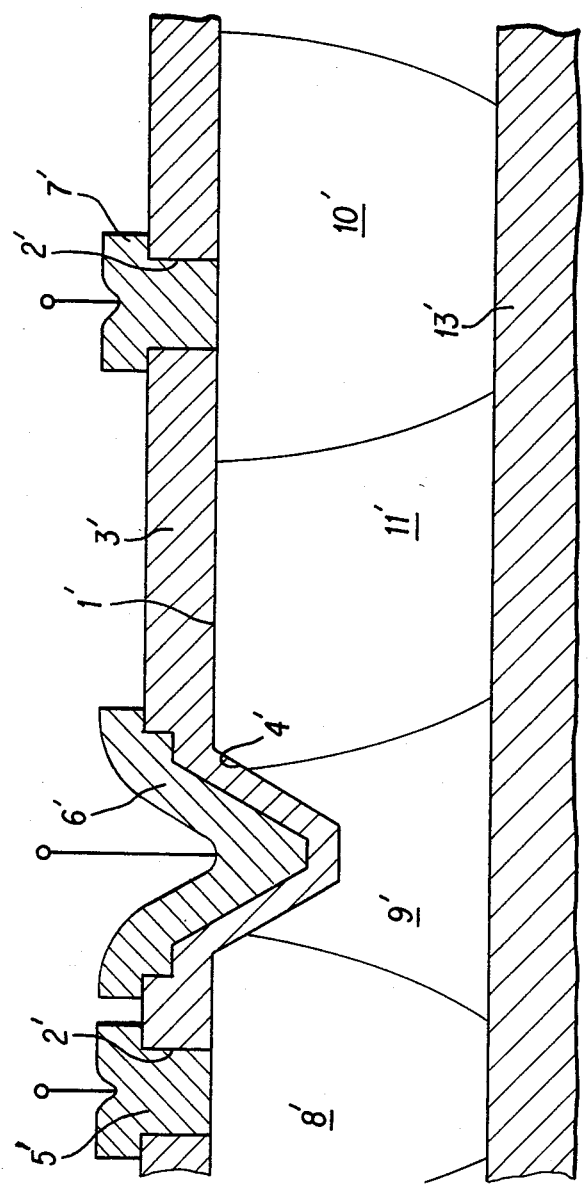
FIG. 2 shows a sectional view of a controllable semiconductor device according to the invention having asymmetric construction and a decreasing cross-section toward its insulating support material.

The layout of the upper surface 1' of the semiconductor device shown in FIG. 2 corresponds to that of the device of FIG. 1; however the recess 4' is U-shaped.

The total amount semiconductor material is positioned on the support layer 3', which comprises insulating material such as for example sapphire, as a thin epitaxial layer. The thickness of the epitaxial layer is in the order of magnitude from about 0.5 to 5 microns.

As is shown in FIG. 2 a first region 8' is disposed under the cathode electrode 6'. The first region 8' contacts the entire lower surface of the cathode electrode 5' at the level of surface 1' of the semiconductor device and borders on the upper part of the left side of the recess 4'. The first region 8' narrows toward the bottom of the substrate 11' and contacts the support layer. A channel region 9' adjoins on the right the first region 8' and borders on the lower part of the recess 4'.

The channel region 9' extends toward the bottom of the substrate and borders at the support layer 3'. A substrate area 11' is adjacent to the right side of the channel region 7' and also borders in part with the right side of the recess 4' and with a part of the upper surface 1' of the semiconductor material; at the bottom it is adjacent to the support layer 13'. A second region 10' is disposed to the right of the substrate area 11'. The second region is disposed below the anode electrode 7', which covers completely the total contact surface of the second electrode 7' at the semiconductor surface 1' and narrows down to the bottom bordering at the support layer 13'.

In the following the function of the semiconductor device shown in FIG. 2 is described in more detail. With reverse bias voltage the anode electrode 7' is negative with respect to the cathode electrode 5'. The p-n junction between the first electrode region 8' and the channel region 9' as well as between the substrate area 11' and the second region 10' are blocked. The p-n junction between the channel region 9' and the substrate 11' is open. The expansion of the space charge layer of the p-n junction between the first region 8' and the channel region 9' beyond the lower side of the recess 4' in the direction of the substrate area 11', is obstructed by the recess 4' such that a union of the space charge areas of the p-n transitions between the first area 8' and the channel region 9' as well as between the channel region 9' and the substrate area 11' is prevented up to high voltages, which would cause a punch-through and are therefore outside of the normal operating range. The width of the substrate area 11' and the doping concentration (magnitude $10^{14}$ to $10^{16}$ and preferably about $10^{15}$ cm$^{-3}$, is such that the voltage required for the union of the space charge layers of the blocked p-n transition between the substrate area 11' and the second region 10' is approximately that which would be required for the union of the space charge layers of the p-n transitions between the first region 8' and the channel region 9' and between the channel region 9' and the substrate area 11'. At the same time, a shorter minority carrier life time in thin semiconductor layers in the embodiment of FIG. 2 is achieved when compared with bulk semiconductor substrate as shown in FIG. 1.

Correspondingly, only a small blocking current is flowing in reverse direction (below of the punch-through voltage). The influence of a voltage applied to the control electrode 6' is of little consequence for the functioning of the device, biased in reverse direction as was already described in FIG. 1.

In forward biasing, the anode electrode 7' is positive versus the cathode electrode 5'. The p-n junctions between the first region 8' and the channel region 9' as well as between the substrate area 11' and the second region 10' are forward biased and the p-n junction between the channel region 9' and the substrate area 11', are reverse biased and receive the main part of the applied voltage. The voltage at the control electrode 6' is initially such that no inversion channel is generated.

The formation of a space charge layer of the reverse biased p-n junction between channel region 9' and the substrate region 11' in the direction of the first electrode region 8' is obstructed by the recess 4' and the space charge layer does not extend much beyond the deepest point of the recess 4'. Thus, an uncontrolled punch-through in forward direction is prevented.

If a positive voltage is applied to the control electrode 6' with respect to cathode 5', then as already discussed in relation to FIG. 1, an inversion channel is formed below the recess 4', which causes due to feeding charge carriers into the substrate area 11' the transition of the semiconductor device into a low resistance condition, that is into a conducting state (firing).

The same advantage as described in connection with FIG. 1, namely that the semiconductor device can be interrupted by the control electrode 6, is achievable by providing between the cathode electrode 5' and the channel region 9' an electrically conducting connection and/or that the depth of the recess 4' in the semiconductor material takes more than a third of the total thickness of the latter, and the voltage at the control electrode 26 is made negative.

The use of thin semiconductor layers on an insulating support layer 13' provides for example the possibility to improve the insulation, to decrease the capacity and to lower the blocking currents of the device. By the provision of a transparent insulating support layer 13' it becomes possible to control currents by means of light.

Figure 3:
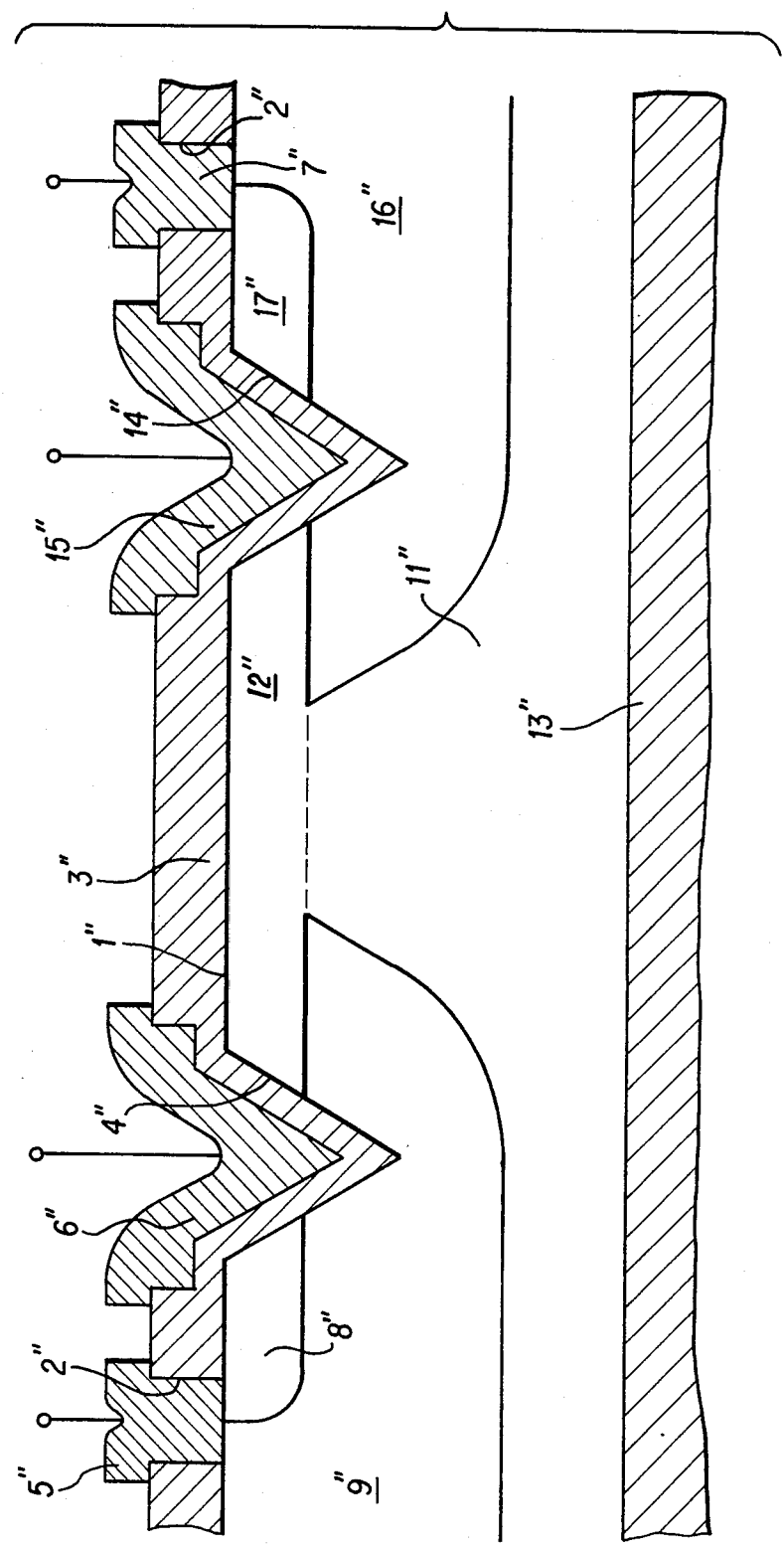
FIG. 3 is a sectional view of another embodiment of a controllable semi-conductor device according to the invention having symmetrical construction.

FIG. 3 shows a controllable semiconductor device with a symmetrical construction.

The construction of the cathode electrode 5", the recess 4" with the control electrode 6", and the layer construction including the support layer 13" are identical to the corresponding construction in FIG. 1.

The particularity of the present embodiment can be found in that an additional V-shaped recess 14" with an additional control electrode 15" having the same construction as the first recess 4" with the control electrode 6". The recess 14" is disposed to the left of the anode electrode 7" that is between the control electrode 6" and the anode electrode 7". The layer construction under the additional recess 14" and the anode electrode 7" are mirror-like and preferably mirror-identical to the layer construction under the cathode electrode 5" and the recess 4". Under the anode electrode 7" there is provided n+-doped first electrode are 17" (mirror-symmetrical to area 8"), which contacts at a part of the right side of the additional recess 14". This region 17" does not contact the anode electrode 7" completely but leaves open a certain area where additional channel region 16" (mirror-symmetrical to region 9"), contacts the anode electrode 7". The mirror-like doped channel region 16" has a trough-like shape and extends from the anode electrode 7" under the mirror-symmetrical region 17", surrounds the tip of the additional V-shaped recess 14" and ends to the left of the additional recess 14" at the level of the first region 8" and the additional region 17".

The substrate area 11" comprises a region 12" of a higher doping concentration in the order of more than about $10^{19}$ cm$^{-3}$, which adjoins the right side of the recess 4" and runs to the left side of the additional recess 14" under the surface 1" of the semiconductor material at a level of the first region 8.

The functioning of the controllable semiconductor device shown in FIG. 3 corresponds to the functioning of two antiparallel connected semiconductor devices according to FIG. 1.

The function of the first region 8" as described in connection with FIG. 1, is selectively taken over either by the first region 8" or by the second mirror-symmetrical region 17" in the embodiment of FIG. 3 depending on the polarity of the voltage between the cathode electrode 5" and the anode electrode 7". For example, if the anode electrode 7" is positive versus the cathode electrode 5" then the semiconductor device can be controlled from the control electrode 6" and in the conducting state (fired state) the current flows via the anode electrode 7", the mirror-symmetrical region 17", the substrate area 11" and its region 12", the inversion channel generated under the recess 4" and via the first electrode region 8" to the electrode 5".

In the case of reversed polarity the current flows in a corresponding opposite way. Thus the control of the current in both directions is made possible by the control electrode 6" or the additional control electrode 15".

When both control elements 6" and 15" are under a sufficiently large positive voltage applied via an electrical connection between the two control electrodes 6" and 15" and/or via the application of an a.c. voltage, then firing and interrupting in both directions of the current is made possible and the characteristic curve is symmetrical.

It will be understood that each of the elements described above, or two or more together, may also find a useful application in other types of system configurations and signal-processing procedures differing from the types described above.

While the invention has been illustrated and described as embodied in the context of some semiconductor devices, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A gate controlled semiconductor device comprising:
a support element;
a semiconductor substrate of first conductivity type disposed on the support element and defining a top surface; said substrate having a V- or U-shaped recess protruding from the top surface;
a first insulating layer covering the recess;
an electrically conducting layer disposed on the first insulating layer for forming a gate;
a second insulating layer covering the top surface of the semi-conductor substrate and having at least two openings;
a first ohmic contact disposed at one opening located at one side relative to the gate;
a first electrode connected to the first ohmic contact;
a first semiconductor region of first conductivity type but having a larger concentration of majority carriers than the substrate, said first semi-conductor region being disposed in contact with the first ohmic contact and extending up to the neighboring side of said recess in the semiconductor;
a second ohmic contact disposed at a second opening located at the second side relative to the gate;
a second electrode connected to the second ohmic contact;
a second semiconductor region of second conductivity type but having a larger concentration of carriers than the substrate and being adjacent to the second ohmic contact;
said substrate extending at least to the proximity of the opposite side of the recess;

a channel region having, in the absence of electrical fields, second conductivity type and being disposed adjacent and below the tip of the recess, adjacent to the substrate, to the first semiconductor region, and to a portion of the first ohmic contact.

2. The gate controlled semiconductor device according to claim 11 wherein the ohmic contact comprises a metal.

3. The gate controlled semiconductor device according to claim 1 wherein the ohmic contact comprises polycrystalline silicon.

4. The gate controlled semiconductor device according to claim 1 wherein the substrate has electrons as majority carriers.

5. The gate controlled semiconductor device according to claim 1 wherein the substrate has holes as majority carriers.

6. The gate controlled semiconductor device according to claim 1 further comprising an electrically conducting connection between the first electrode, the first semiconductor region and the channel region.

7. The gate controlled semiconductor device according to claim 1 wherein the semiconducting substrate is disposed on an insulating support.

8. The gate controlled semiconductor device according to claim 7 wherein the first insulating layer has a thickness of from about 0.5 to 5 microns.

9. The gate controlled semiconductor device according to claim 1, further comprising a third semiconductor region of first conductivity type but more heavily doped than the substrate, disposed at the side of the recess, without the necessity of touching the recess, neighboring to the second ohmic contact and extending along the upper surface of the semiconductor substrate toward the second semiconductor region without contacting it.

10. A gate controlled semiconductor device comprising a support element;
a semiconductor substrate of first conductivity type disposed on the support element; a first recess formed in the semiconductor substrate;
a first insulating layer covering the first recess;
a first electrically conducting gate layer disposed on the first insulating layer for forming a first gate;
a second recess formed in the semiconductor substrate;
a second insulating layer covering the second recess;
a second electrically conducting gate layer on the second insulating layer for forming a second gate;
a third insulating layer covering the top of the semiconductor, said third insulating layer having a first opening neighboring to the first recess but remote from the second recess and a second opening neighboring to the second recess but remote to the first recess;
a first ohmic contact disposed at the first opening;
a cathode electrode connected to the first ohmic contact;
a first semiconductor region of first conductivity type but having a larger concentration of dopants than the substrate and disposed adjacent to a portion of the first ohmic contact and extending up to the neighboring side of the first recess in the semiconductor substrate;
a first channel region having in the absence of applied electrical fields, second conductivity type and disposed adjacent and below the first recess, adjacent to a portion of the first ohmic contact and adjacent to the first semiconductor region;
a second ohmic contact disposed at the second opening;
an anode electrode connected to the second ohmic contact;
a second semiconductor region having first conductivity type but having a larger concentration of dopants than the substrate and disposed below the second ohmic contact and extending up to the neighboring side of the second recess in the semisemiconductor substrate;
a second channel region having in the absence of applied electrical fields, second conductivity type and disposed adjacent and below the second recess and adjacent to the second semiconducting region; and
a third semiconductor region of first conductivity type but more heavily doped than the substrate reaching at least to the proximity of the sides of the first and second recesses neighboring to each other, and remote from the first and second ohmic contacts respectively.

* * * * *